US006553533B2

(12) United States Patent
Demura et al.

(10) Patent No.: US 6,553,533 B2
(45) Date of Patent: *Apr. 22, 2003

(54) METHOD AND APPARATUS FOR DETECTING AND CORRECTING ERRORS AND ERASURES IN PRODUCT ECC-CODED DATA ARRAYS FOR DVD AND SIMILAR STORAGE SUBSYSTEMS

(75) Inventors: Masayuki Demura, Ebina (JP); Hironobu Nagura, Yokohama (JP); Tetsuya Tamura, Yamato (JP); Keisuke Tanaka, Yokohama (JP)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/245,803

(22) Filed: Feb. 5, 1999

(65) Prior Publication Data

US 2002/0099996 A1 Jul. 25, 2002

(30) Foreign Application Priority Data

Feb. 5, 1998 (JP) ............................................ 10-024875

(51) Int. Cl.$^7$ ................................................ G11C 29/00
(52) U.S. Cl. ........................ 714/769; 714/785; 714/755
(58) Field of Search ............................... 714/746, 762, 714/763, 769, 784, 6, 785, 755, 701, 756; 369/53, 35; 341/94; 360/48, 40, 135

(56) References Cited

U.S. PATENT DOCUMENTS 5,351,246 A * 9/1994 Blaum et al. ................... 714/6
5,920,578 A * 7/1999 Zook ............................ 714/755
6,047,395 A * 4/2000 Zook ............................ 714/756
6,223,322 B1 * 4/2001 Michigami et al. ......... 714/701

OTHER PUBLICATIONS

Gui–Liang Feng et al. (A new procedure for decoding cyclic and BCH codes up to actual minimum distance; IEEE, Sep. 1994).*
Kraft, C. (Closed solution of Berlekamp's algorithm for fast decoding of BCH codes; IEEE, Dec. 1991).*
Feng, G.–L et al. (A generalization of the Berlekamp–Massey algorithm for multisequence shift–register synthesis with applications to decoding cyclic codes: IEEE, Sep. 1991).*
Yuan Xing Lee et al.(An on–the–fly decoding technique for Reed–Solomon codes: IEEE, Sep. 1996).*
Suming Ju et al.(Fast decoding algorithm for RS codes; IEEE, Aug. 14, 1997.*
Lin et al., "Error Control Coding: Fundamentals and Applications", *Prentice–Hall, Inc.*, copyright 1983, pp. 274–278.

* cited by examiner

*Primary Examiner*—Albert Decady
*Assistant Examiner*—Guy Lamarre
(74) *Attorney, Agent, or Firm*—R. Bruce Brodie; Marc D. McSwain

(57) ABSTRACT

A method and apparatus for detecting and correcting errors and erasures in product-coded data arrays by iterative syndrome processing array data in row major order and column major order. A first dense map is formed for classifying each row containing location indicia of random errors, their correction patterns, and pointers to rows containing erasure errors. This map is used to effectuate row array random error corrections in place in memory. A second dense map is formed of location indicia and correction patterns for each pair adjacent position within a column containing erasure errors as indexed by a counterpart row pointer. The second map is used to effectuate column array erasure corrections and random error corrections in place in memory.

18 Claims, 12 Drawing Sheets

TABLE

| | BOX 1 | | BOX 2 | | BOX 3 | | BOX 4 | | BOX 5 |
|---|---|---|---|---|---|---|---|---|---|
| COLUMN 1 | NE1-1 POS=#1 | NE1-1 BP | E1-1 POS=#2 | E1-1 BP | NE1-2 POS=#3 | NE1-2 BP | E1-2 POS=#4 | E1-2 BP | |
| COLUMN 2 | NE2-1 POS=#1 | NE2-1 BP | E2-1 POS=#2 | E2-1 BP | E2-2 POS=#4 | E2-2 BP | | | |
| COLUMN 3 | E3-1 POS=#2 | E3-1 BP | NE3-1 POS=#3 | NE3-1 BP | E3-2 POS=#4 | E3-2 BP | | | |
| COLUMN 4 | E4-1 POS=#2 | E4-1 BP | E4-2 POS=#4 | E4-2 BP | | | | | |

FIG. 4
(PRIOR ART)

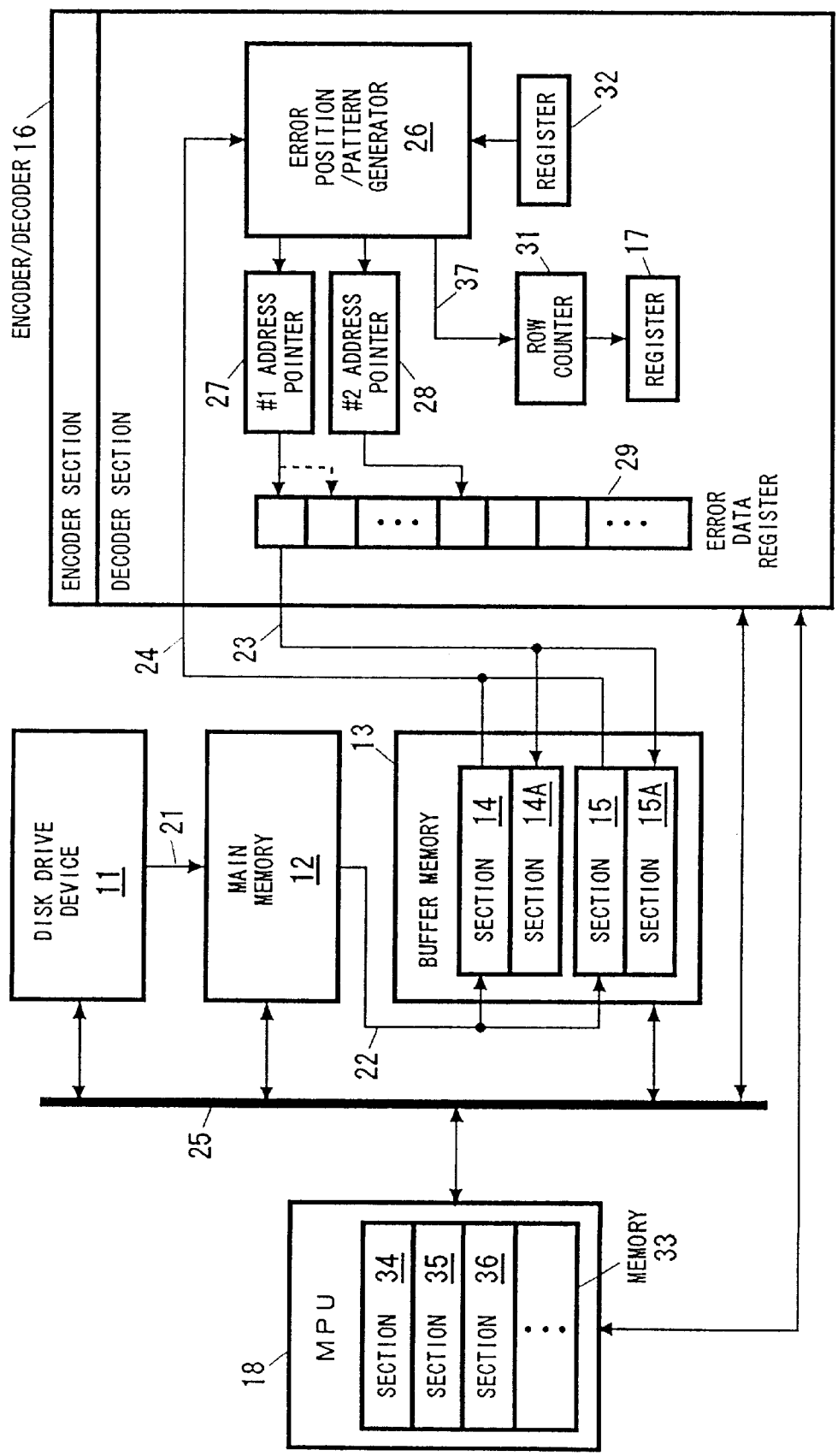
F I G. 5

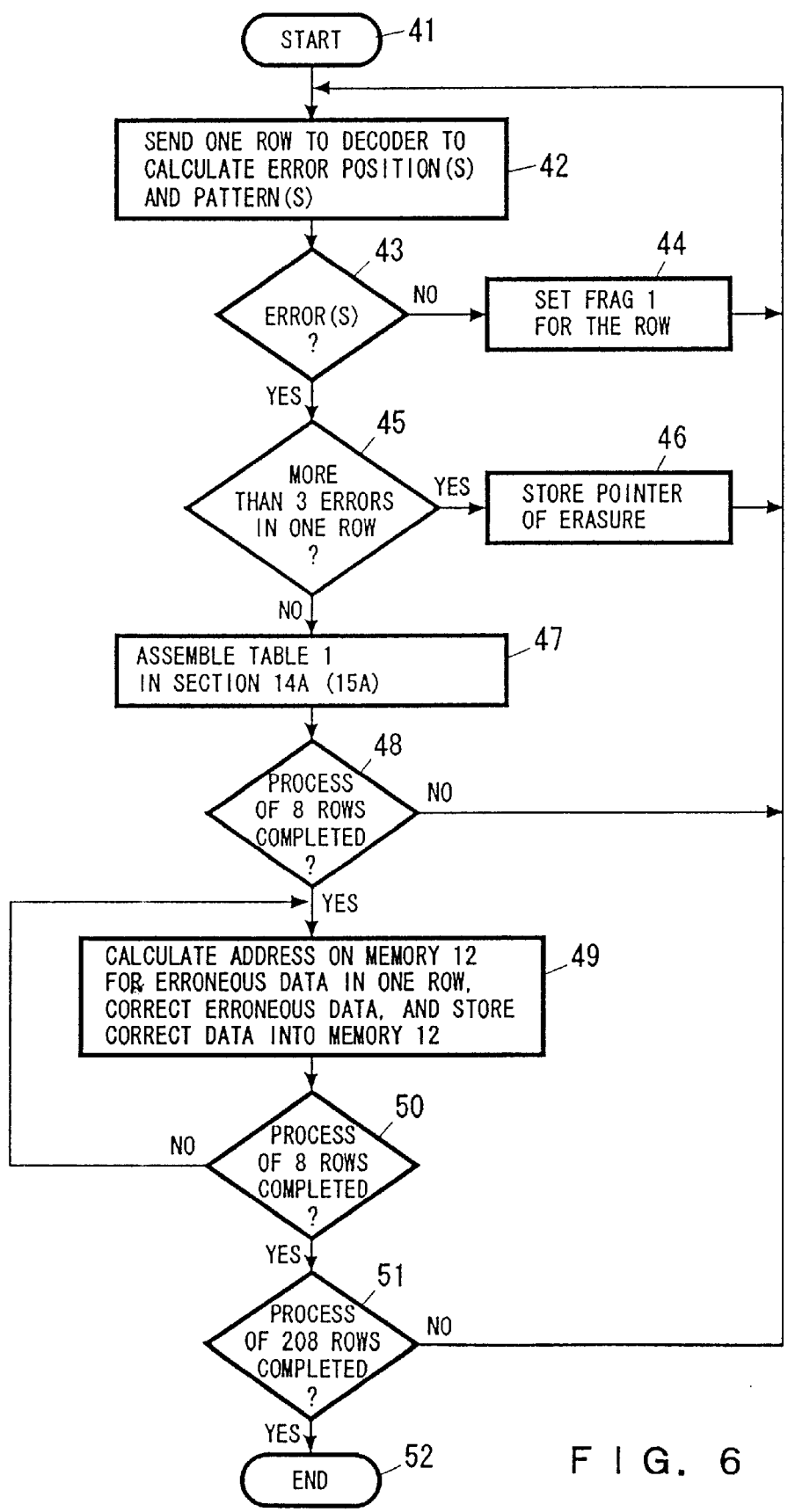
F I G. 6

TABLE 1

| | BOX 1 | | BOX 2 | | BOX 3 | BOX 4 | BOX 5 |
|---|---|---|---|---|---|---|---|
| | NE1-1 | NE1-1 | NE1-2 | NE1-2 | | | |
| ROW 1 | POS =#5 | BP | POS =#7 | BP | | | |
| | NE3-1 | NE3-1 | NE3-2 | NE3-2 | | | |
| ROW 3 | POS =#4 | BP | POS =#7 | BP | | | |
| | NE5-1 | NE5-1 | NE5-2 | NE5-2 | | | |
| ROW 5 | POS =#3 | BP | POS =#7 | BP | | | |

F I G. 7

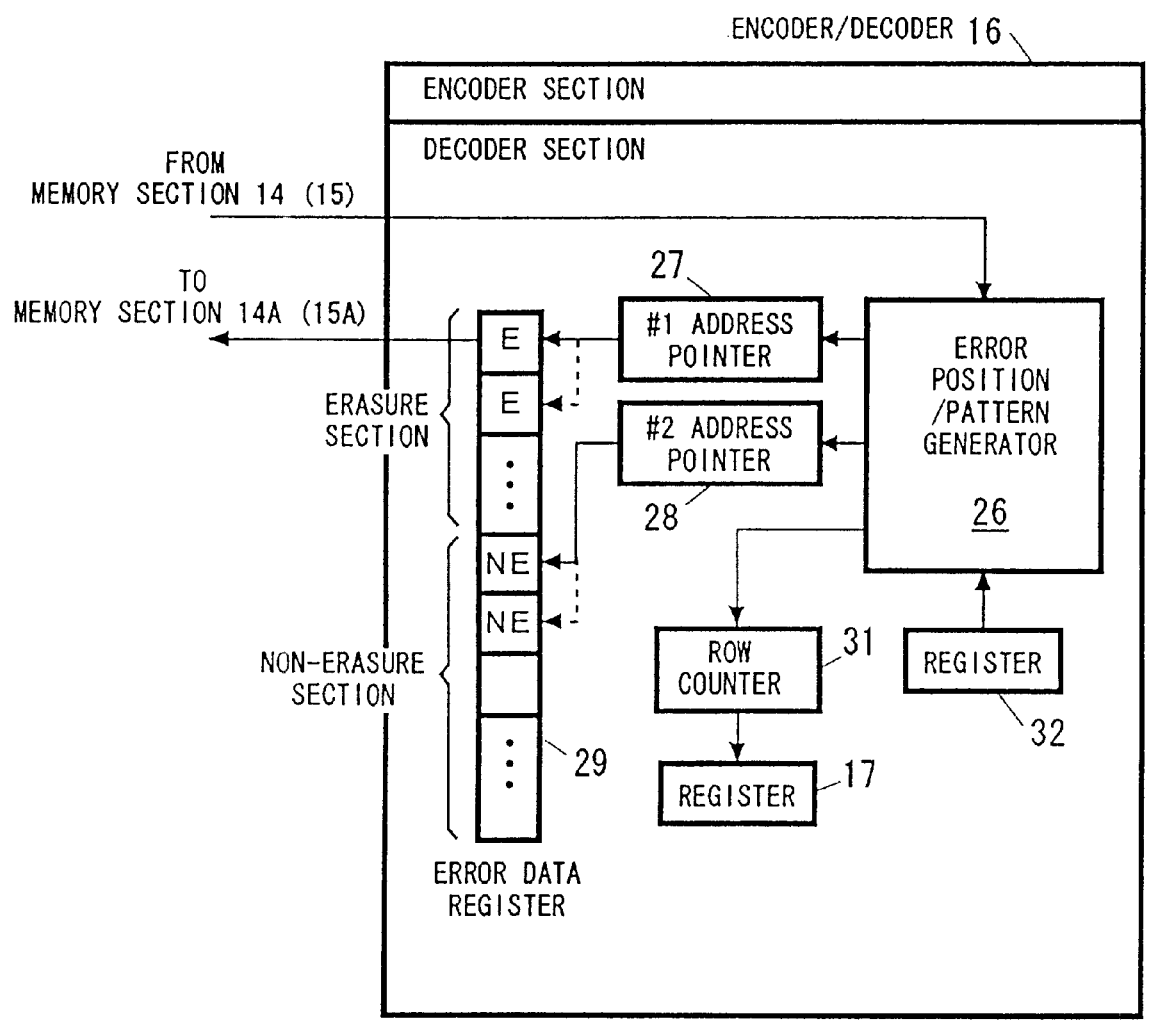
F I G. 1 2

METHOD AND APPARATUS FOR DETECTING AND CORRECTING ERRORS AND ERASURES IN PRODUCT ECC-CODED DATA ARRAYS FOR DVD AND SIMILAR STORAGE SUBSYSTEMS

FIELD OF THE INVENTION

This invention relates to methods and apparatus for processing product (rectangular) error correction-coded (ECC) data arrays, and more particularly to increasing the processing speed of such methods and apparatus where the arrays are jointly affected by random error and erasure.

DESCRIPTION OF RELATED ART

In the prior art, digital versatile disk or alternatively digital video disc (DVD) optical storage technology has received significant attention. In this regard, DVD is similar to that of a CD-ROM. However, it possesses a substantially greater storage capacity. Structurally, a DVD uses a single spiral track on a reflective metal surface packaged in plastic. The spiral track contains pits that are read by a drive laser as values of one or zero bits. DVD increases the data capacity of the disk by increasing the pit density and the number of tracks. As the pits become smaller and more densely packed, a smaller laser is required to read the disk. DVD uses a 635-nanometer laser compared with a 780-nanometer laser on the standard CD-ROM. Current laser support doubles the pits per track, and doubles the tracks per surface area available on a CD-ROM. DVD further increases capacity by using a more efficient sector format. The base capacity of DVD disks is 4.7 GB (single side/single layer), while the capacity of the CD-ROM use is in the order of 650 MB.

It is also well known in the prior art to use finite field, algebraic, block, or cyclic codes for detecting and correcting multiple bytes in error in long byte strings read back from a cyclic, concentric, tracked storage medium such as a magnetic disk storage subsystem or the like. Typically, each byte string of predetermined length is treated as if it were an algebraic polynomial and subject to modulo division by an encoding polynomial. If the code is denominated as being "systematic", then redundant bytes derived from the data are appended to the data string which otherwise remains intact. In the case of linear block codes, the remainder is appended to the end of the data byte string. Each data byte string plus the appended remainder is then recorded on a storage medium or transmitted. Subsequently, when the data is accessed and played back from the medium, a remainder is in principle recalculated from the datastream as it is extracted and compared with the recorded remainder. If the remainder values comparison match, the difference result is zero. If the results do not match (nonzero difference), then this is indicative or error or erasure. The codes are quite advanced such that the remainders are processed not only for identifying the presence of error, but also for pinpointing its location and determining the correction values to be applied to the datastream. This is termed syndrome processing. Codes useful for error detection and correction are called "ECC" codes.

A Reed-Solomon (RS) code exemplifies linear cyclic ECC codes used extensively in magnetic recording and communications. One advantage of RS codes is that they maintain maximum distance among codewords for any given length of data. This "spacing" between permissible codewords renders them useful for detecting and correcting randomly occurring byte errors as well as burst errors over a run of contiguous bytes. Reference should be made to Hassner et al., copending application Ser. No. 08/838,375; now U.S. Pat. No. 5,942,005 "Method and Means for Computationally Efficient Error and Erasure Correction in Linear Cyclic Codes", filed Apr. 8, 1997, for a detailed description of a high-performance ECC detection and correction method and apparatus embedded in the recording channel path of a magnetic disk storage subsystem.

The RS code among other ECC codes is one dimensional in that it is defined over a data byte string of predetermined length. Such encoding is adequate for one-dimensional data recording or transmission such as is found on concentric, tracked magnetic disk storage. However, optical recorded images are recorded as data arrays. In this mode, so-called product or rectangular codes suitable for protecting data arrays have been extant for some time.

A product-coded data array as defined in Lin et al., "Error Control Coding: Fundamentals and Applications", Prentice-Hall, Inc., copyright 1983, at pp. 274–278, comprises a data array or rectangle of data bytes in which $K_1$ rows and $K_2$ columns are formed. Then, a horizontal ECC code of PI bytes is appended to each row and a vertical code of PO bytes is appended to each column. This results in an array of dimensions $(K_1+PI) \times (K_2+P0)$. The rate (k/n) of the rectangular code is:

$$k/n = (K_1 \times K_2)/(K+P1)(K_2+P0).$$

When the data is read from any storage system, the data bytes are subject to error and erasure from random, intermittent, recurrent sources. These may be due to media defects, signal coupling between tracks, extraneous signals induced in the readback path, etc. In the case of a one-dimensional data array such as a row vector, error patterns may occur as random bytes in error or clustered together as a run of contiguous bytes in error. One related consequence is the fact that as the number of errors in any given row increase, then the likelihood of miscorrection by the ECC decoder increases. As Lin et al. point out at page 275, in a product-coded, two-dimensional array, one process of error detection and correction involves first error decoding the rows and then error decoding the columns. If the density of errors is relatively low, then row correction might be sufficient. However, if the density in some portions of some rows is high, then row error decoding might result in the old errors being cured and new errors being created.

It is generally desired to correct the errors in place. This means that an array is read from the medium and written into a sufficiently sized buffer or RAM and memory local to the storage subsystem. One processing problem is that the local buffer or RAM must be repeatedly referenced in the column as well as row directions. This substantially increases both decoding time and complexity in the processing of errors and erasures.

SUMMARY OF THE INVENTION

It is an object of this invention to devise a method and apparatus for detecting and correcting errors and erasures in product-coded data arrays.

It is a related object to devise a method and apparatus for error and erasure detection and correction of systematic ECC product-coded data arrays as used in DVD or other optically readable data recording subsystems.

It is yet another object that such method and apparatus efficiently effectuate detection and correction of errors and erasures of the ECC product-coded data array in place as imaged from a storage or communications source into a buffer or RAM local to said source.

For purposes of this invention, each syndrome-detected "error" connotes an unknown syndrome value change of one or more symbols at an unknown location or position within an array row. Relatedly, each syndrome-detected "erasure" connotes the fact that while the value of the change is unknown, the location and position within the array are known.

It was unexpectedly observed that if the statistics of miscorrection were taken into account on a row basis, then an erasure should be defined as the occurrence of three or more contiguous errors in a row. It was further observed that the processing speed of the arrays could be enhanced if rows containing random errors could be processed in the row direction and erasure processing deferred until processing of the columns. It was relatedly observed that row and column processing necessarily involved scanning and forming a dense map identifying the error locations and correction values after which the correction could be effectuated as indexed by the dense map.

Thus, a systematic ECC product-coded data array is read from storage or from a communications source and is written into a local buffer or RAM and scanned in row major order. Concurrently, a dense map of rows is formed containing random errors and their correction values. Also, pointers to rows containing erasures are generated and saved. Next, the random errors are corrected in the array in place in the buffer or memory by logically combining the map-stored corrections with the counterpart array value. The second phase involves column correction. This involves scanning the array in column major order to form a second dense map of columns in which the columns containing erasure corrections are clustered together, and the columns containing corrections for random errors only are clustered together. The pointers to the rows identify the columns containing erasure errors, and the erasure corrections are determined using pairwise adjacent row values and placed in the map.

The correction of columns proceeds in column major order. This means the columns containing erasure-only errors or mixed erasure and random errors are first processed. When this has been completed, the columns containing only random errors are processed. The logic of this process assumes that most random errors will be resolved during row processing. It is anticipated, however, that occasionally miscorrection during row processing will occur. This will result in a random error distribution over some rows of the array. Thus, some array columns will contain either erasure-only error, mixed erasure or random error, or random-only error. In those columns containing erasure-only and mixed erasure and random error terms, the erasure corrections are first determined with reference to the pair adjacent row terms. Next, the random error terms are ascertained by processing the ECC bytes defined over that column. The columns containing erasure-only or mixed errors are then corrected with reference to the second. Lastly, an extension map;covering the remaining columns containing only random errors is built, and the corrections calculated and then applied to the counterpart columns in column major order to complete the process.

More particularly, the above objects are satisfied by a machine-implementable method for detecting and correcting errors and erasures by a processor in systematic product linear block or cyclic error correction-coded (ECC) data arrays written into a memory, the processor being capable of accessing the memory. The method comprises the steps of (a) iteratively syndrome processing the array data in row major order, and (b) iteratively syndrome processing the array data in column major order.

The first step includes forming a first map classifying each row containing location indicia of random errors, their correction patterns, and pointers to rows containing erasure errors. It further includes effectuating row array random error corrections in place in memory according to the first map. In a similar vein, the second step includes forming a second map containing location indicia and correction patterns for each pair adjacent position within each column containing erasure errors as indexed by a counterpart row pointer. An extension of the second map is also formed but it is to obtain location indicia within each column containing random errors and their correction patterns. The second step necessarily includes effectuating column array erasure corrections and random error corrections in place in memory according to the second map.

BRIEF DESCRIPTION OF THE DRAWINGS

FIG. 4 sets forth a table or dense map used in the error correction in the column direction of the system of the prior art.

FIG. 5 exhibits a DVD system for correcting the errors in the coded data in accordance with the present invention.

FIG. 6 depicts a flowchart for performing the error correction on the product-coded array data in the row direction.

FIG. 7 shows a first dense map or table used to effectuate the error correction in the row direction.

FIG. 12 shows a systematic ECC product encoder/decoder in accordance with the present invention.

DESCRIPTION OF THE PREFERRED EMBODIMENT

Figure 1:
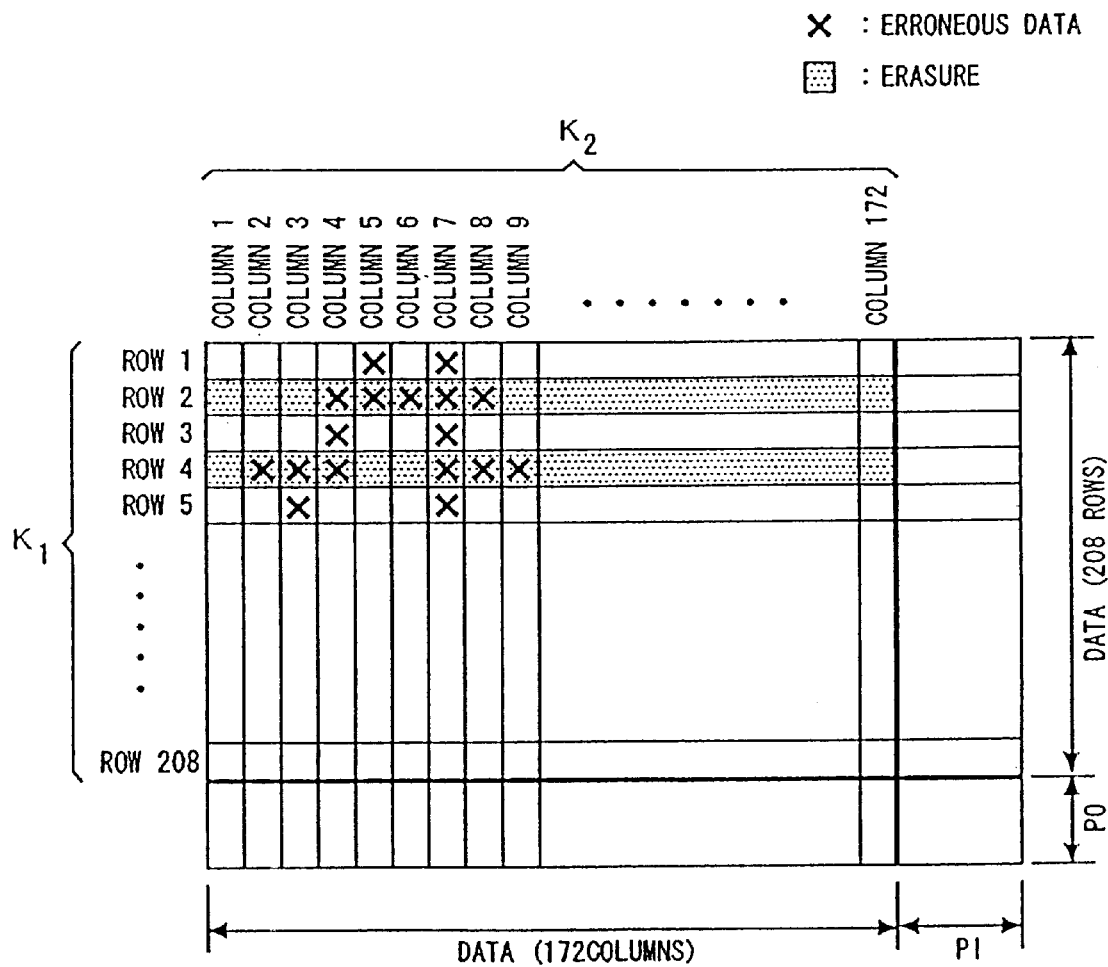
FIG. 1 depicts an array of systematic ECC product-coded data.

Referring now to FIG. 1, there is shown an array of systematic ECC product-coded data. In this figure, the data is arranged in an array of $K_1$ (208 rows)_$K_2$ (172 columns) wherein each of $K_1$ and $K_2$ is a positive integer, an error correction code, i.e., PO (parity-outer code), is added to the data of each column of a vertical direction, and an error correction code, i.e., PI (parity-inner code), is added to the data in each row of a horizontal direction. In this specification, a crosspoint of one row and one column denotes an array position. Each position includes eight bits representing the data or symbol. Each row includes 172 positions. These are numbered 1 through 172 and from left to right. Each column includes 208 positions numbered 1 through 208 and assigned from top to bottom position. Illustratively, the position at the crosspoint of row 2 and column 4 is called position #4 in the row direction, or called position #2 when viewed in the column direction.

Referring again to FIG. 1, the symbol "X" denotes erroneous data. Row 1 includes erroneous data in positions #5 and #7, while row 2 includes erroneous data in positions #4 through #8, etc. In processing systematic ECC product-coded arrays, the erroneous data in the row direction is initially corrected with the erroneous data in the column direction being subsequently corrected. That is, the error correction of the 208 rows is initially performed, then the error correction of the 172 columns is performed. The data and the PI in the row direction are fetched to perform the error correction of the data in each row, and the data and the PO in the column direction are fetched to perform the error correction of the data in each column. The rows 1 through 208 and the error correction codes are serially recorded in the DVD of a disk drive device and read by a read head, not shown and stored in a main memory 1 shown in FIG. 3. A portion of the coded data shown in FIG. 1, such as rows 1 through 8, is sent to a buffer memory 2. Each row is sent to an error position/pattern generator 4 of an encoder/decoder 3 shown in FIG. 3, which are well known in the art.

Figure 3:
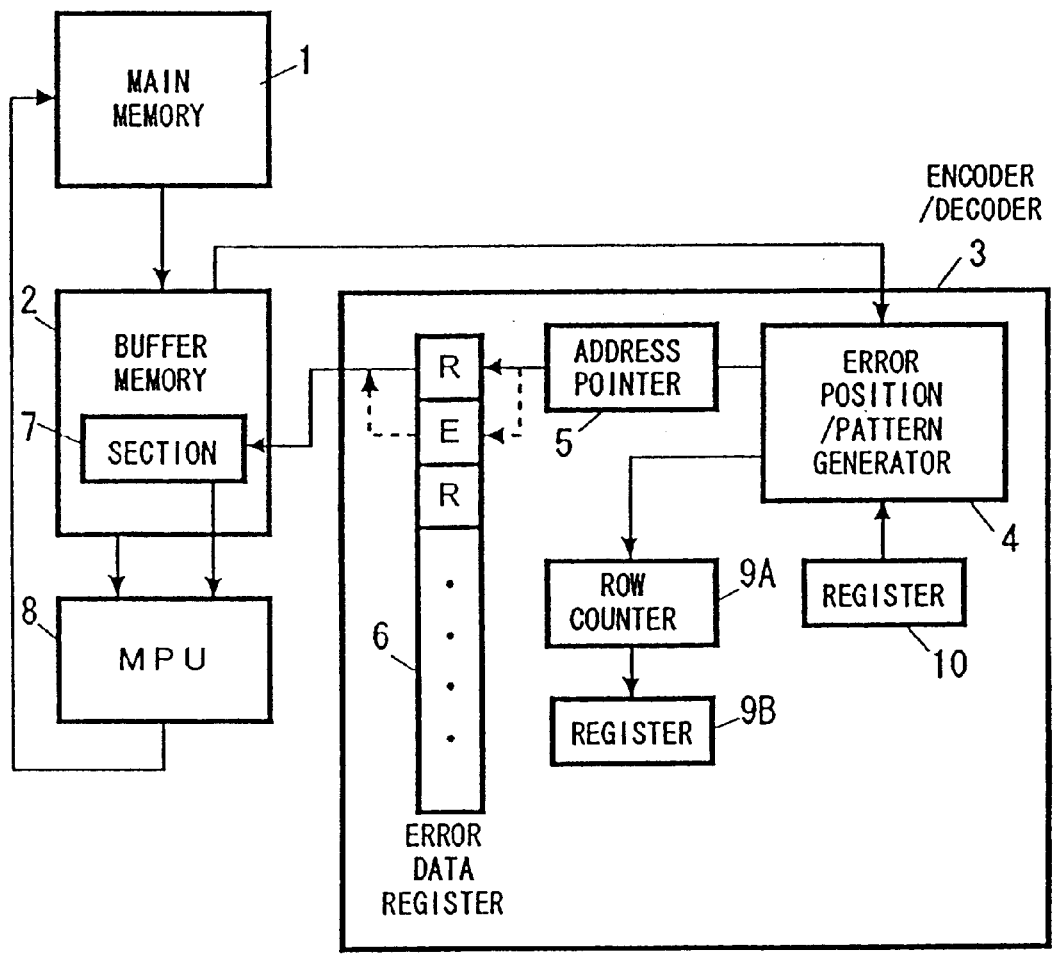
FIG. 3 illustrates a prior array logic for correcting the errors in systematic ECC product-coded data.

Referring now to FIG. 3, there is illustrated a prior array logic for correcting the errors in systematic ECC product-coded data. Information that is required for the error position/pattern generator 4 performs the error correction in the row direction and the direction. The error position/pattern generator 4 performs a Chien search function, well known in the art, which generates an expression for generating positions of the erroneous data and bit patterns for correcting the erroneous data, and calculates the positions of the erroneous data and the bit patterns based upon the expression.

It is assumed that three erroneous data maximum can be corrected in the error correction of each row. If the number of erroneous data in one row is equal to or larger than four, as in the case of rows 2 and 4, this row is called "erasure" as well known in the art, and the erroneous data of rows 2 and 4 are not corrected in the error correction in the row direction, and the pointer of the erasure rows, i.e., rows 2 and 4, are stored in a register 9B of the encoder/decoder 3 for the error correction in the column direction. The error position/pattern generator 4 sends a signal indicating that one row being processed is the erasure to a row counter 9A which sets the pointer of the row in register 9B. The erroneous data in rows 2 and 4 handled as the erasure are corrected in the error correction in the column direction. The row including the erroneous data less than four, such as rows 1, 3, and 5 in FIG. 1 is called "nonerasure" herein.

Figure 2:
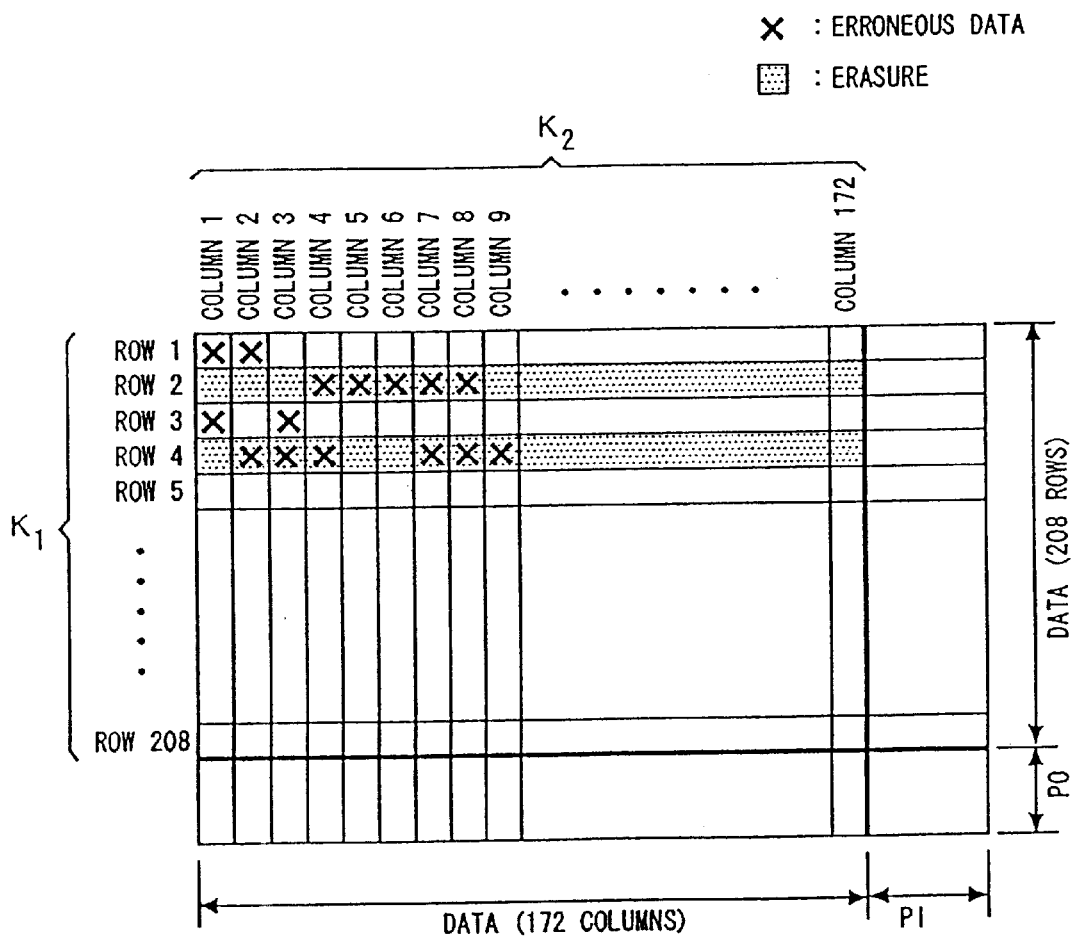
FIG. 2 shows erasures and miscorrection errors in rows of data subject to correction of random errors.

Referring now to FIG. 2 taken together with FIG. 3, there is shown erasures and miscorrection errors in rows of data subject to correction of random errors. The erroneous data in positions #1 and #2 of row 1 and positions #1 and #3 of row 3 are newly generated. These errors are newly generated by erroneously correcting data in these positions. The positions of the data or symbols in each column are defined as positions #1 through #208 from the top to bottom of the column, as described before.

Referring now to FIG. 3, the error position/pattern generator 4 is provided in column error correction with the pointers of the erasure rows, i.e., rows 2 and 4, found in the error correction in the row direction. The pointers of the erasure, i.e., rows 2 and 4, are used as a parameter inputted to an expression of error correction based on a Reed-Solomon code, for example. Since a decoding algorithm of the Reed-Solomon code is well known, the error correction algorithm is described in the above copending Hassner et al. application. A maximum correctable number of erasures N is represented by the following expression:

$$N=16-(2\times \text{number of erroneous data in the nonerasure}).$$

If the erroneous data in the column direction does not include the erroneous data belonging to the nonerasure, the N equals 16, and if three erroneous data belonging to the nonerasures are included, the N equals 10. The coded data including the 208 data and the PI of the first column 1 stored in a buffer memory 2 are supplied to the error position/pattern generator 4. The error position/pattern generator 4 determines the position(s) of the erroneous data belonging to the nonerasures and generates a bit pattern for correcting the erroneous data. Also, the error position/pattern generator 4 determines the position of the erroneous data belonging to the erasure(s) based upon the pointers, rows 2 and 4 in the case of column 1, and generates bit patterns for correcting data belonging to the erasure.

Referring now to FIG. 4, there is set forth a table or dense map used in the error correction in the column direction of the system of the prior art. More particularly, in the error correction of column 1, the error position/pattern generator 4 finds the erroneous data belonging to the nonerasure in position #1, generates a bit pattern for correcting the erroneous data, and generates a second information block including NE1-1, position (POS)=#1 and NE1-1, BP (bit pattern). This is shown in box 1 of column 1 of the table in FIG. 4. In this box, NE1-1 indicates that it is the first erroneous data belonging to the nonerasure in column 1, POS=#1 indicates that the position of the erroneous data is in position #1, and BP indicates the bit pattern for correcting the erroneous data.

The error position/pattern generator 4 sends the second information block to a first stage of an error data register 6 through an address pointer 5. There are two information blocks. The first information block includes data indicating a position at which data belonging to a row classified as the erasure is stored and a pattern for correcting the data at the position. The second information block includes position data indicating a position at which the erroneous data belonging to a row classified as the nonerasure is stored and a pattern for correcting the erroneous data at the position.

Next, the error position/pattern generator 4 finds the first erroneous data belonging to the erasure in position #2 based upon the pointer "row 2". It then generates a bit pattern for correcting the erroneous data. Likewise, it generates a first information block including E1-1, position (POS)=#2 and E1-1, and BP (bit pattern). This is shown in box 2 of column 1 in FIG. 4. In FIG. 4, E1-1 indicates that it is the first erroneous data of the erasure in column 1. Also, POS=#2 indicates that the position of the erroneous data is in position #2, and the BP indicates the bit pattern for correcting the erroneous data.

The error position/pattern generator 4 sends the first information block to a second stage of the error data register 6 through the address pointer 5. Next, the error position/pattern generator 4 finds the second erroneous data belonging to the nonerasure in position #3, generates a bit pattern for correcting the erroneous data, and generates a second information block. The second block includes NE1-2, position (POS)=#3 and NE1-2, BP (bit pattern), as shown in box 3 of a column in FIG. 4. Significantly, NE1-2 indicates that it is the second erroneous data belongs to the nonerasure of column 1, the to POS=#3 indicates that the erroneous data occupies position #3, and BP indicates the bit pattern for correcting the erroneous data. The error position/pattern generator 4 sends the second information block to a third stage of the error data register 6 through an address pointer 5.

The error position/pattern generator 4 next finds the second erroneous data belonging to the erasure in position #4 based upon the pointer "row 4", and generates a bit pattern for correcting the erroneous data. The generator 4 provides a first information block including E1-2, position (POS) #4 and E1-2, BP (bit pattern). This, too, is shown in box 4 of column 1 in FIG. 4. In this regard, E1-2 indicates that it is the second erroneous data belongs to the erasure in column 1. POS=#4 indicates that erroneous data occupies position #4, and the BP indicates the bit pattern for correcting the erroneous data. The error position/pattern generator 4 sends the first information block to a second stage of the error data register 6 through the address pointer 5. In this manner, the error position/pattern generator 4 sequentially finds the erroneous data of column 1 and sends the above information block for each erroneous data to the error data register 6 through the address pointer 5. When the operation for generating the above information blocks of column 1 is terminated, the contents of the error data register 6 are serially sent to section 7 of the buffer memory 2. The above information blocks of column 1 are assembled in section 7 as the table shown in FIG. 4. The above operation is repeated for successive columns 2, 3, . . . , and the table shown in FIG. 4 is assembled in section 7 in the buffer memory 2.

Referring again to FIGS. 1–4, the operation of the error correction in column 1 is now to be considered. In the prior art embodiment, an MPU 8 fetches the second information block of box 1 in column 1 in the dense map or table in FIG. 4. This is now stored in section 7 and calculates an address on the main memory 1 which stores the original data corresponding to the data of position #1 in column 1. Next, the MPU 8 fetches the data in position #1 from the buffer memory 2, corrects the fetched data by using the bit pattern included in box 1, and writes the corrected data into the calculated address of the main memory 1. Next, the MPU 8 fetches the first information block of box 2 in column 1 in the dense map or table in FIG. 4 and calculates an address on the main memory 1 which stores the original data corresponding to the data of position #2 in column 1. Next, the MPU 8 fetches the data in position #2 from the buffer memory 2, corrects the fetched data by using the bit pattern included in box 2, and writes the corrected data into the calculated address of the main memory 1.

Referring now to FIG. 5, there is exhibited a DVD system for correcting the errors in the coded data in accordance with the present invention. A disk drive device 11 includes the data recording disk or the DVD serially storing the coded data shown in FIG. 1, a spindle motor for rotating the DVD, and a read head for reading the coded data from the DVD. Since the DVD, the spindle motor, and the read head are well known in the art, these are not shown in FIG. 5.

The error correction process of the present invention is described by using the coded data shown in FIG. 1 for simplifying a comparison of the error correction process of the present invention with that of the prior technology. Rows 1 through 208 and the error correction codes PO and PI of the coded data of FIG. 1 recorded on the DVD are serially read and stored in a main memory 12, such as DRAM, through line 21. A buffer memory 13, such as SRAM, includes four memory sections 14, 14A, 15, and 15A. The memory sections 14 and 15 are used as a cache memory with higher processing speed than the main memory 12.

A part of the coded data, such as a group of 8 rows and a next group of 8 rows are stored in memory sections 14 and 15 in the process of error correction in the row direction, and a part of the coded data, such as a group of 8 columns and a next group of 8 columns are stored in memory sections 14 and 15 in the process of error correction in the column direction. The memory sections 14A and 15A are used to store a dense map or table 1 shown in FIG. 7 and a dense map or table 2 shown in FIG. 10 assembled in the error correction in the row or column direction, respectively.

Referring again to FIG. 5, an encoder/decoder 16 includes an encoder section which generates the PI and PO when a new data of 208 rows_172 columns are stored into the DVD, and a decoder section which includes the error position/pattern generator 26 for generating the first and second information blocks for assembling the dense maps or tables 1 and 2, first and second address pointers 27 and 28, an error data register 29, row counter 31, register 17, and register 32. The operation of these components are described later. MPU 18 controls the operation of the disk drive device 11, main memory 12, buffer memory 13, and encoder/decoder 16, and includes a memory 33 which contains memory sections 34, 35, and 36. As described before, the error position/pattern generator 26 performs a Chien search function, well known in the art, which generates an expression for generating positions of the erroneous data and bit patterns for correcting the erroneous data, and calculates the positions of the erroneous data and the bit patterns based upon the expression.

Error Correction in the Row Direction

Referring now to FIG. 6, there is shown a flowchart for performing the error correction on the product-coded array data of FIG. 1 in the row direction. The operation of the error correction in the row direction is substantially the same as that of the prior technology. The MPU 18 controls the operation of the steps of FIG. 6. It is noted that the row including the erroneous data equal to or less than a predetermined number is called the nonerasure, the row including the erroneous data larger than the predetermined number is called the erasure, and the information blocks of the dense map or table 1 is used to correct the erroneous data in the nonerasure. In the exemplary embodiment, the number "3" is selected as the predetermined number. The operation starts at step 41 and a first group of 8 rows is fetched from the main memory 12 and stored in the memory section 14, and a second group of 8 rows is fetched from the main memory 12 and stored in the memory section 15. The error correction of the first group of 8 rows is made by the operation through a first loop operation through steps 42–50. When the process of to the first group is completed, a third group of 8 rows is stored in the memory section 14, and the error correction of the second group of 8 rows stored in the memory section 15 is started.

The purpose of the operation of steps 42–48 is to classify each of the 8 rows, rows 1–8 in this case, into the nonerasure and the erasure, and to assemble the dense map or table 1 shown in FIG. 7. The operation proceeds to step 42 wherein the coded data including the $K_2$ data and the PI of row 1 are sent to the error position/pattern generator 26 through line 24. The error position/pattern generator 26 calculates positions of erroneous data and bit patterns for correcting the erroneous data based upon the error correction code PI. For the first erroneous data in position #5 of row 1, the error position/pattern generator 26 generates a bit pattern (BP) for correcting the erroneous data. It also generates a second information block including NE1-1, position (POS)=#5 and NE1-1, BP (bit pattern). This is set out in box 1 of row 1 in FIG. 7.

In this case, NE1-1 indicates that the erroneous data of row 1 is classified as the nonerasure. POS=#5 indicates that the position of the erroneous data is in position #5, and the BP indicates the bit pattern for correcting the erroneous data. The error position/pattern generator 26 sends the second information block to a first stage of the error data register 29 through the first address pointer 27. It is noted, as described before, that an information block which includes position data indicating a position at which data belonging to a row classified as the erasure is stored and a pattern for correcting data at the position is called the first information block. The second information block includes data indicating a position-at which erroneous data belonging to a row classified as the nonerasure is stored and a pattern for correcting the erroneous data at said position.

For second erroneous data in position #7 of row 1, the error position/pattern generator 26 generates a bit pattern for correcting the erroneous data, and generates a second information block including NE1-2, position (POS)=#7 and NE 1-2, BP (bit pattern), as shown in box 2 of row 1 shown in FIG. 7, wherein the NE1-2 indicates that it is the second erroneous data of row 1 classified as the nonerasure, the POS=#7 indicates that the position of the erroneous data is position #7, and the BP indicates the bit pattern for correcting the erroneous data. The error position/pattern generator 26 sends the second information block to a second stage of the error data register 29 through the first address pointer 27. The operation proceeds to step 43 wherein the error position/pattern generator 26 determines whether row 1 includes erroneous data. If the answer at step 43 is NO, the operation proceeds to step 44 wherein flag 1 for this row is set in the memory section 36 in the MPU 18. If the answer at step 43 is YES, the operation proceeds to step 45 wherein the error position/pattern generator 26 determines whether a total number of erroneous data in one row is more than three.

That is, the row is classified into the erasure or the nonerasure in step 45. If the answer at step 45 is YES, the operation proceeds to step 46, wherein the error position/pattern generator 26 sends a signal indicating that the current row is the erasure to row counter 31. Row counter 31 sets the row number of the erasure as a pointer to register 17. In this manner, the pointer of the row classified as the erasure is stored in register 17 of the decoder section. In the case of row 1, row 1 is the nonerasure and hence the answer at step 45 is NO, and the operation proceeds to step 47 wherein the second information block including NE1-1, position (POS)=#5 and NE 1-1, BP (bit pattern), and the second information block including NE 1-2, position (POS)=#7 and NE1-2, BP (bit pattern) are sent to the memory section 14A from the error data register 29 to assemble the first row of the dense map or table 1.

It is noted that the dense map or table 1 shown in FIG. 7 is the map or table assembled in the memory section 14A for the first group of rows 1–8, and that only the first address pointer 27 is used in the error correction in the row direction. The operation proceeds to step 48. In this step, the decoder section determines whether all 8 rows have been processed. If the answer at step 48 is YES, the operation proceeds to step 49. In the exemplary case, the answer at step 48 is NO and the operation returns to step 42. Also, the coded data of row 2 is sent to the error position/pattern generator 26. Since row 2 includes the erroneous data and the number of errors included in row 2 is larger than three, row 2 is classified as the erasure in step 45. The operation proceeds to step 46 wherein the pointer "row 2" is stored in register 17, and the operation returns to step 42. In this step, the next row 3 is sent to the error position/pattern generator 26, and the error position/pattern generator 26 generates the second information block including NE3-1, position (POS)=#4, NE3-1 BP for the first erroneous data, and the second information block, NE3-2, position (POS)=#7, NE3-2 BP of the second erroneous data, and sends these two second information blocks to the first stage and the second stage of the error data register 29 through the first address pointer 27.

The operation proceeds to step 43 and the answer YES is generated. Control then passes to step 45. The result of this step is to generate a NO answer. This devolves from the fact that row 3 includes only two erroneous data, and row 3 is classified as the nonerasure. The operation proceeds to step 47. In this step, the above two second information blocks in the error data register 29 are sent to row 3 of the dense map or table 1 in the memory section 14A. The operation proceeds to step 48 and the answer at step 48 is NO in this case, and the operation returns to step 42 and the above-described operation is repeated until the answer at step 48 becomes YES. When step 48 is YES, this indicates that all 8 rows of the first group have been processed, the pointers of the erasures i.e., "row 2" and "row 4", stored in the register 17 of the decoder section are transferred to the memory section 34 of the MPU 18, and second information blocks of the nonerasures in the 8 rows have been assembled in the dense map or table 1 in the memory section 14A of buffer memory 13.

The purpose of the operation of steps 49 and 50 is to correct the erroneous data of the rows classified as the nonerasure in the 8 rows based on the second information blocks of the dense map or table 1 shown in FIG. 7. In the operation of step 49, the MPU 18 fetches the second information block of box 1 of row 1 of the dense map or table 1 shown in FIG. 7 to calculate an address of the main memory 12 which stores the erroneous data of position #5 of row 1 based on-position data #5 in the second information block. The MPU 18 fetches the erroneous data, for example, 8-bit data "00000001" of position #5 of row 1 from section 14, and executes an exclusive OR operation of the erroneous data "00000001" and the bit pattern (BP) for correcting the erroneous data, for example, "00000001", resulting in the corrected 8-bit data "00000000". The MPU 18 stores the corrected data into the address of the main memory 12. In this manner, the original data of position #5 of row 1 stored in the main memory 12 is corrected.

When all the erroneous data in one row is corrected in step 49, the operation proceeds to step 50 wherein the MPU 18 determines whether the process of the 8 rows has been completed. If the answer at step 50 is NO, the operation returns to step 49. If the answer at step 50 is YES, the operation proceeds to step 51 wherein the MPU 18 determines whether the process of the 208 rows has been completed. If the answer at step 51 is NO, the operation returns to step 42. In this step, the processing of the next 8 rows, i.e., rows 9–16, in the memory section 15 is started, and the new dense map or table 1 for the next 8 rows is assembled in the memory section 15A. If the answer at step 51 is YES, the operation terminates at step 52.

For each group of 8 rows, the operation through steps 42–50 is repeated and the erroneous data in the row classified as the nonerasure, which is stored in the main memory 12, is corrected based on the second information blocks of the dense map or table 1, and the pointer(s) of the row classified as the erasure is accumulated in the memory section 34 of the MPU 18. When the process of the 208 rows has been completed, the pointers of the row classified as the erasure are stored in the memory section 34 of the MPU 18. The answer YES at step 51 indicates that the process for correcting one erroneous data is repeated 3_208 times in maximum in the case that all the rows are the nonerasure and all the rows include three erroneous data.

Result of the Error Correction in the Row Direction

The exemplary result of the error correction in the row direction is shown in FIG. 2, which was referred to in the description of the prior technology. As stated before, the erroneous data in positions #1 and #2 of row 1 and the erroneous data in positions #1 and #3 of row 3 are newly generated. These new erroneous data are generated by erroneously correcting the correct data in these positions. A probability of the generation the erroneous correction in one row in the error correction in the row direction depends on the number of correctable erroneous data in one row, as below.

| Number of Correctable Erroneous Data | Probability of Generation of Erroneous Correction |
| --- | --- |
| 5 | $10^{-1}$ |
| 4 | $10^{-3}$ |
| 3 | $10^{-6}$ |
| 2 | $10^{-8}$ |
| 1 | $10^{-11}$ |

In the exemplary embodiment, the number of correctable erroneous data in one row is three so that viewing the data in the column direction, the probability of generating the erroneous data belonging to the nonerasure in one column is $10^{-6}$, and the remaining erroneous data in one column belong to the erasures. Accordingly, in the error correction in the column direction, almost all the erroneous data included in one column belong to the erasure. However, the exemplary case shown in FIG. 2 in which the first column includes the newly-generated two erroneous data in positions #1 and #3 is selected for the purpose of the description.

Error Correction in the Column Direction

Figure 8:
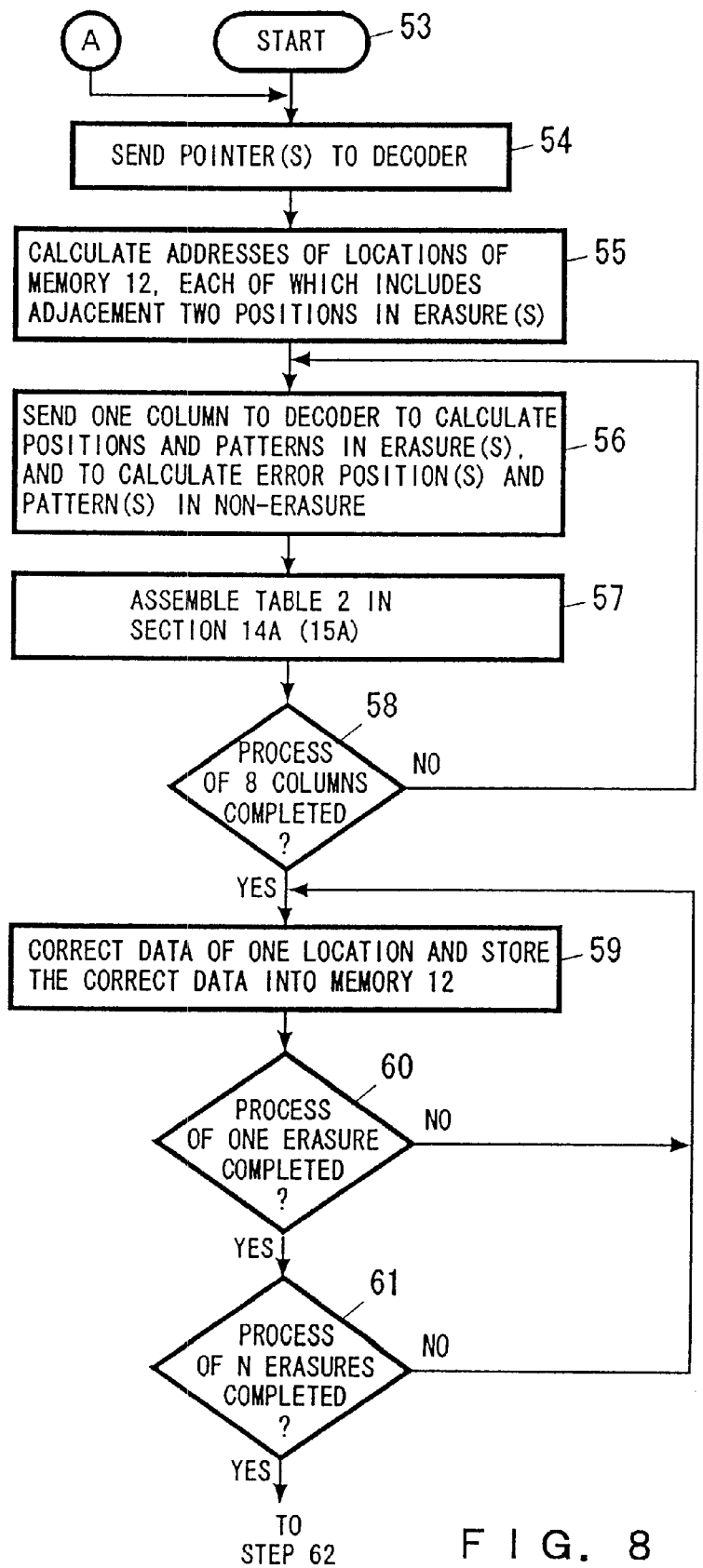
FIG. 8 illustrates a flowchart for performing the error correction of the erasures on the product-coded data array in the column direction in accordance with the present invention.
Figure 9:
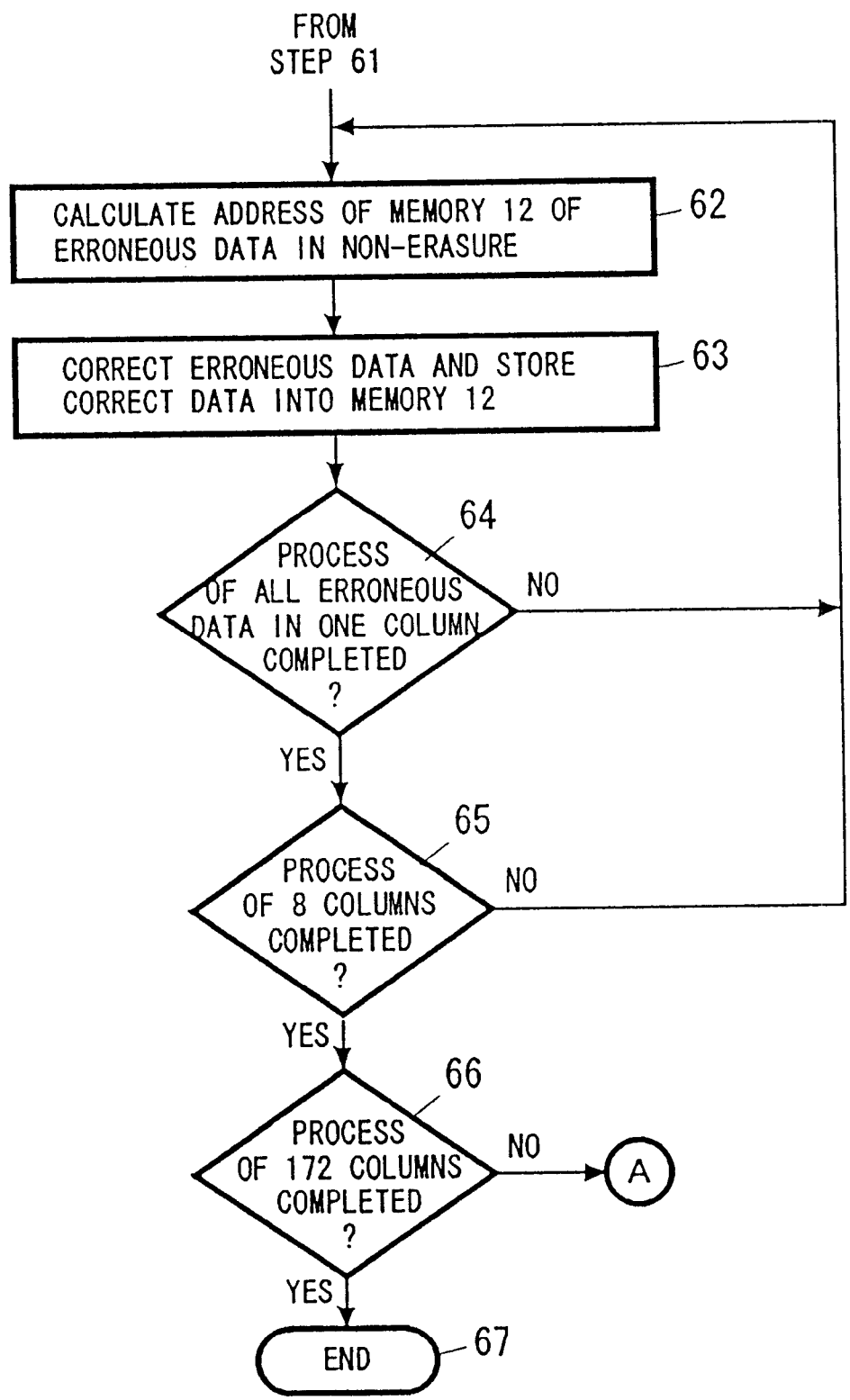
FIG. 9 sets forth a flowchart for performing the error correction of the nonerasures on the product-coded data array in the column direction.

Referring now to FIGS. 8 and 9, there is shown, respectively, a flowchart for performing the error correction of the erasures on the product-coded data array in the column direction in accordance with the present invention, and a flowchart for performing the error correction of the nonerasures on the product-coded data array in the column direction with respect to the coded data array of FIG. 2.

Figure 10:
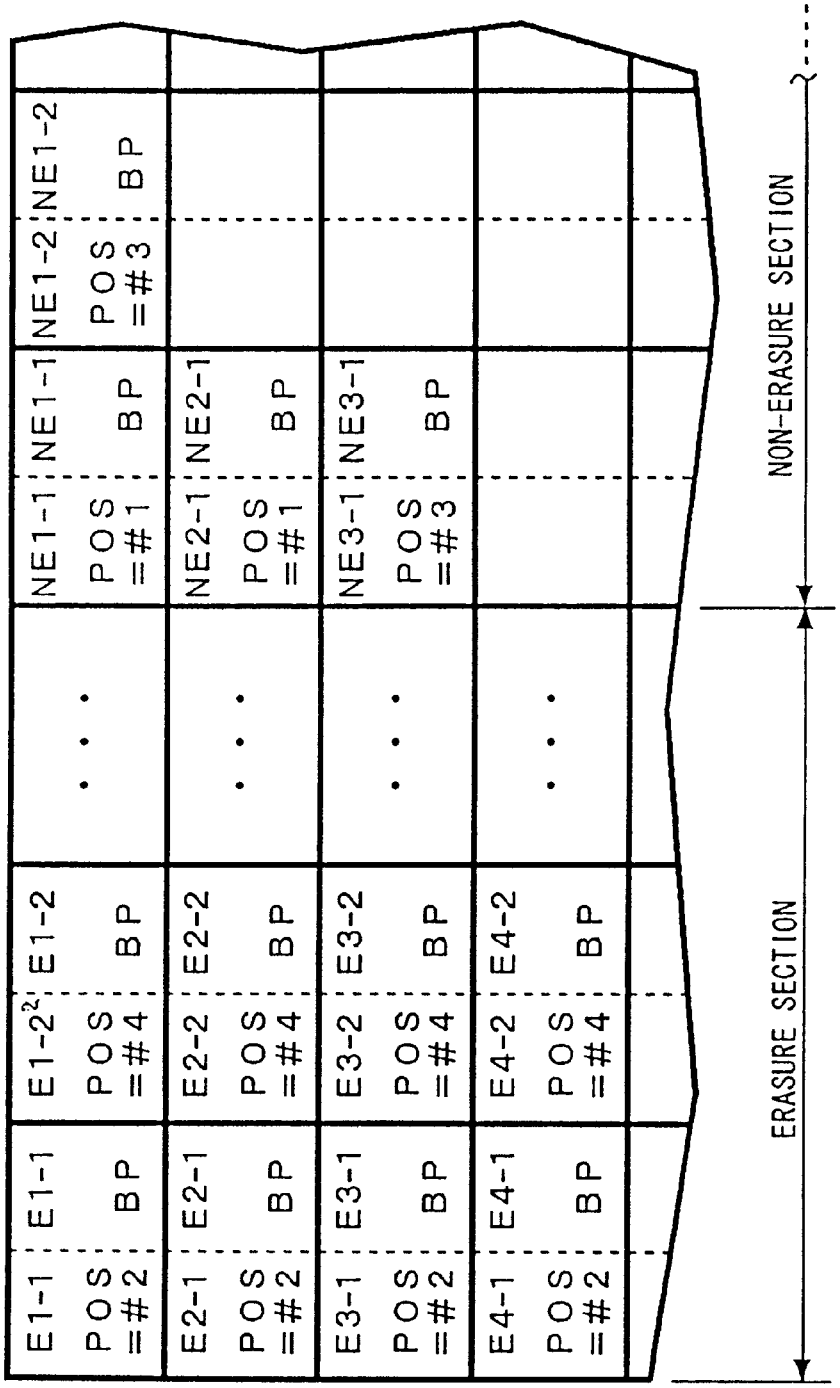
FIG. 10 exhibits a second dense map or table used to effectuate the error correction in the column direction as expressed in FIGS. 8 and 9.

Briefly described, the purpose of the operation of steps 54–58 is to assemble the dense map or table 2 shown in FIG. 10. The operation starts at step 53 and a first group of 8 columns is fetched from the main memory 12 and stored in the memory section 14, and a second group of 8 columns is fetched from the main memory 12 and stored in the memory section 15. The error correction of the first group of 8 columns is made by the operation through steps 54–65. When the process of the first group is completed, a third group of 8 rows is stored in the memory section 14, and the error correction of the second group of 8 rows stored in the memory section 15 is started. The operation proceeds to step 54 wherein the MPU 18 sends the pointer of the erasures, i.e., row 2, row 4, now stored in the memory section 34 of the MPU 18 to register 32 of the decoder section.

Figure 11:
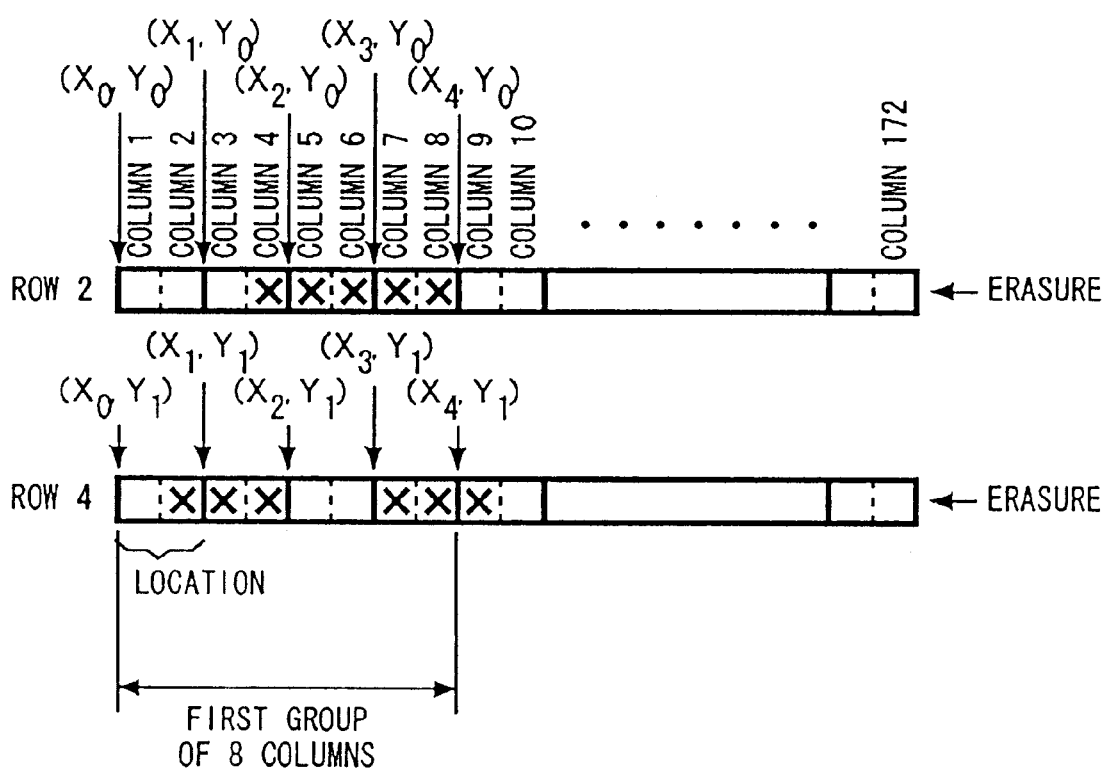
FIG. 11 depicts addresses of locations in a main memory showing pairwise selection of adjacent bytes in rows containing erasure errors.

The operation proceeds to step 55 wherein the MPU calculates addresses of locations of the main memory 12, each of which includes adjacent two positions of the erasure based on the pointers of the erasure, i.e., row 2, row 4, . . . , stored in the memory section 34. Referring to FIG. 11, columns 1–8 of rows 2 and 4, which are classified as the erasure, are divided into four locations, each of which includes two data of the adjacent two positions. The first location of row 2 includes the two data of columns 1 and 2, the second block of row 2 includes the two data of columns 3 and 4, and so on. The MPU 18 calculates the address, such as $(X_0, Y_0)$, $(X_1, Y_0)$, etc. of the 8 locations on the main memory 12 for rows 2 and 4, including columns 1–8, as shown in FIG. 11, and the MPU 18 stores these addresses in the memory section 35 of memory 33.

The flow of control now passes step 56 wherein the coded data of column 1 is sent to the error position/pattern generator 26 through line 24 to generate the first information blocks and second information blocks, as shown in the dense map or table 2 of FIG. 10. The error position/pattern generator 26 can detect whether the error is of the random or erasure type based on the pointers of the erasure stored in register 32. More particularly, for random errors (row 1) in position #1 of column 1, error position/pattern generator 26 calculates position #1 and a bit pattern (BP) for its correction. It then generates the second information block including NE1-1, position (POS)=#1 and NE1-1, BP (bit pattern). This is set out in box X of a nonerasure section or a second part of column 1 shown in the dense map or table 2 of FIG. 10. Relatedly, NE1-1 indicates that it is the first erroneous data that is the nonerasure in column 1. POS=#1 indicates that the position of the erroneous data is position #1. Lastly, the BP indicates the bit pattern for correcting the erroneous data. The error position/pattern generator 26 sends the second information block to a first stage of a nonerasure section of the error data register 29 through the second address pointer 28, as shown in FIG. 12.

It is noted that both the first and second address pointers 27 and 28 of the decoder section are used in the error correction of the column direction. Also, the error data register 29 is divided into the erasure section into which the first information blocks belonging to the erroneous data of the erasure are stored through the first address pointer 27. The nonerasure section into which the second information blocks of the erroneous data are stored is through the second address pointer 28. For the erasures found in row 2 in position #2 of column 1, the error position/pattern generator 26 calculates position #2 and a bit pattern (BP) for correcting the erasure. It also generates a first information block including E1-1, position (POS)=#2 and E1-1, and BP (bit pattern). This is shown in box 1 of the erasure section or a first part of column 1 of the dense map or table 2. Here, E1-1 indicates that it is the first erroneous data belonging to the erasure in column 1. POS=#2 indicates that the erroneous data is located in position #2. The BP indicates the bit pattern for correcting the erroneous data. The error position/pattern generator 26 sends the first information block to a first stage of the erasure section of the error data register 29 through the first address pointer 27, as shown in FIG. 12.

In the same manner, the error position/pattern generator 26 generates the second information block including NE1-2, position (POS)=#3 and NE1-2, BP (bit pattern) and stores the second information block in the second stage of the nonerasure section of the error data register 29 through the second address pointer 28, then generates the first information block including E1-2, position (POS)=#4 and E1-2, BP (bit pattern) and stores the first information block in the second stage of the erasure section of the error data register 29 through the first address pointer 27. When information blocks of all the erroneous data of column 1 have been stored in the error data register 29, the operation proceeds to step 57, wherein the first and second information blocks are sent to the memory section 14A of buffer memory 13, whereby column 1 of the dense map or table 2 is assembled. The operation proceeds to step 58 wherein the decoder section determines whether all 8 columns have been processed. If the answer at step 58 is YES, the operation proceeds to step 59. In the exemplary case, the answer at step 58 is NO and the operation returns to step 56, and the coded data of the next column 2 is sent to the error position/pattern generator 26. The operation of the loop of steps 56–58 is repeated until the answer at step 58 becomes YES. When the answer at step 58 is YES, the operation proceeds to step 59.

It is noted that the first information block E1-1 relates to data at the crosspoint of column 1 and row 2 in FIG. 2. This block is stored in box 1 of column 1 of the dense map or table 2 of FIG. 10. Also, the first information block E2-1 relates to data at the crosspoint of column 2 and row 2 in FIG. 2. E2-1 is stored in box 1 of column 2 of the dense map or table 2 of FIG. 10. Similarly, the first information block E3-1 relates to data at the crosspoint of column 3 and row 2 in FIG. 2. It is stored in box 1 of column 1 of the dense map or table 2 of FIG. 10, and so on. That is, the first information blocks relating to the first erasure, i.e., row 2, are arranged in the 172 boxes 1 in the vertical direction of the dense map or table 2. The first information blocks relating to the second erasure, i.e., row 4, are arranged in the 172 boxes 2 in the vertical direction of the dense map or table 2, and so on.

The NPU 18 knows the above relationship of the arrangement. Hence, when the MPU 18 corrects the data at the crosspoint of column 1 and row 2 and the data at the crosspoint of column 2 and row 2, the MPU 18 performs several functions. These include fetching, in parallel, data at the adjacent two positions in the erasure, i.e., row 2 from the memory section 14, and fetching the first information blocks E1-1 and E2-1 from the dense map or table 2. This means that the first information blocks are stored in the erasure section of the dense map or table 2, while the second information blocks are stored in the nonerasure section of the dense map or table 2. Likewise, the first information blocks for the $K_2$ positions in the one row classified as the erasure are stored in the successive boxes in the vertical direction of the dense map or table 2 in the order of generation of the first information blocks.

The effect of the operation of steps 59 and 61 is to reduce the number of accesses to the main memory 13 for correcting the erroneous data belonging to the erasures to the value of N_86, wherein N is the maximum correctable number of erasures. In step 59, the MPU 18 fetches the two data at the adjacent two column positions #1 and #2 in row 2 classified as the erasure in the coded data shown in FIG. 2 from the memory section 14. Furthermore, MPU 18 fetches two first information blocks from the dense map or table 2, i.e., the first information block of box 1 of column 1 and the first information block of box 1 of column 2 in the dense map or table 2 (FIG. 10). The example of the two data is "0000000100000000". That is, the two first information blocks relating to the two data (16-bit data) of the adjacent two column positions of the erasure are fetched from the dense map or table 2.

It is noted that the bit pattern (BP) of the first information block E1-1 is "00000000" and the bit pattern of the first information block E2-1 is "00000000" since the two data at the adjacent two column positions #1 and #2 in row 2 are correct, as shown in FIG. 2. The MPU 18 executes an exclusive OR operation of the fetched data "0000000100000000" and the bit pattern (BP) "0000000000000000", resulting in the 16-bit data "0000000100000000". The MPU 18 stores the resulting 16-bit data "0000000100000000" into the location of the address ($X_0$, $Y_0$) of the main memory 12 as the correct data. The above two data are originally correct and are not corrected by the bit patterns, and hence it can be said that the original two data are reproduced. However, it is customary to say in the field of error correction that the reproduction of the two data is called the correction of the two data, even if they are not actually corrected, and hence it is called the correction of the two data in the specification. The operation proceeds to step 60 wherein the MPU 18 determines whether the process of positions #1 through #8 of the one erasure has been completed.

In the exemplary case, the answer at step 60 is NO. The operation returns to step 59. Of course, the MPU 18 fetches the two data (16-bit data) at the adjacent two positions #3 and #4 in row 2 shown in FIG. 2 from the memory section 14. The MPU 18 also fetches two first information blocks from the dense map or table 2. This is implemented by the first information block of box 1 of column 3 and the first information block of box 1 of column 4 in the dense map or table 2 (FIG. 10). The MPU 18 executes the exclusive OR operation of the 16-bit data and the 16-bit pattern, and stores the resulting 16-bit data into a location of the address ($X_1$, $Y_0$) of the main memory 12 as the corrected data. In this case, the 8-bit erroneous data of position #4 of row 2 is "00000001".

For example, the 8-bit pattern of the first information block E4-1 stored in box 1 of column 4 of the dense map or table 2 is "00000001", resulting in the corrected 8-bit data "00000000". In this manner, the data in four locations of the one erasure including 8 columns shown in FIG. 11 are successively corrected in steps 59 and 60. If the answer at step 60 is YES, the operation proceeds to step 61 wherein the MPU 18 determines whether the process of the N erasures has been completed. If the answer at step 61 is NO, the operation returns to step 59. If the answer at step 61 is YES, it means that the process of all the N erasures including column 1–8 has been completed, wherein N is a maximum correctable number of erasures and the operation proceeds to step 62 in FIG. 9.

It is apparent that the 16-bit data of the adjacent two positions of the erasure are stored at one access operation to the main memory 12 in the present invention. In the prior process performed based on the dense map or table shown in FIG. 4, only the 8-bit data of one position of the erasure is stored at one access operation to the main memory. It is also apparent that, in accordance with the present invention, the number of accesses to the main memory for correcting the data of the erasure can be reduced to substantially half of that in the prior process. Further, the MPU 18 fetches the 16-bit data from the buffer memory 13 and the 16-bit pattern for correcting the erroneous data from the dense map or table 2 stored in the memory section 14A or 15A to correct the 16-bit data of the erasure. In the prior process performed based on the dense map or table shown in FIG. 4, the 8-bit data is fetched from the main memory 1 and the 8-bit pattern is fetched from the dense map or table in FIG. 4. It is apparent that, in accordance with the present invention, the number of accesses to the buffer memory 13 and the dense map or table 2 can be reduced to substantially half of that in the prior process.

Also, in accordance with the present invention, the MPU calculates all the addresses of all locations, each of which includes two data of adjacent two positions of the erasure, all at once in step 55, based on the pointers of the erasure, i.e., row 2, row 4, . . . , stored in the memory section 34. In the prior process, the calculation of the addresses of the main memory 1 is made by the MPU 8 each time the information block of one box is fetched from the dense map or table shown in FIG. 4. The invention can simplify the flow of the operation so that the processing time of the error correction can be reduced. In this manner, the present invention can reduce the processing time for correcting the erroneous data included in the erasures for the reasons described above.

More particularly, the correction of the erroneous data in the erasures occupies the greater part of the error correction in the column direction. For example, the probability of generation of the erroneous data belonging to the nonerasure in one column is $10^{-6}$, and the remaining erroneous data in one column belong to the erasures in the case that the number of correctable erroneous data in one row is three, as described before. That is, almost all the erroneous data in one column belong to the erasure. The present invention can reduce the processing time for correcting erasures in the column direction and thereby reduce the total processing time in both the row and column directions.

Correction of Random Error in the Nonerasure Columns

The process shown in FIG. 9 corrects the erroneous data remaining in the nonerasures including columns 1–8 since the process of all the N erasures including column 1–8 has been completed in step 61 in FIG. 8, as described above. The operation starts at step 62. Here, the MPU 18 fetches the second information block NE1-1 of box X of column 1 of the dense map or table 2 shown in FIG. 10. Next, the MPU 18 calculates an address of the main memory 12 which stores the erroneous data of position #1 of column 1 based on the second information block NE1-1. The operation proceeds to step 63. At this point, the MPU 18 fetches the erroneous data, for example, 8-bit data "00000001", of position #1 of column 1 from section 14, and executes an exclusive OR operation of the erroneous data "00000001" and the bit pattern (BP) for correcting the erroneous data, for example, "00000001". This results in the corrected 8-bit data "00000000".

Lastly, the MPU 18 stores the corrected data in the address of the main memory 12, the address having been calculated in step 62. In this manner, the original data of position #1 of column 1 stored in the main memory 12 is corrected. When one erroneous data is corrected in step 63, the operation returns to steps 62–64. Step 64 determines whether the correction of all erroneous data belonging to the nonerasure in one column has been completed.

If the answer at step 64 is NO, the operation returns to step 62. If the answer at step 64 is YES, the operation proceeds to step 65 wherein the MPU 18 determines whether the process of the 8 columns has been completed. If the answer at step 65 is NO, the operation returns to step 62 to process the next column. If the answer at step 65 is YES, the operation proceeds to step 66 wherein the MPU determines whether the process of all 172 columns has been completed. If the answer at step 66 is NO, the operation returns to step 54 wherein the process of the next 8 columns, i.e., columns 9–16, in the memory section 15 is started, and the third group of 8 columns is stored in section 14.

For each group of 8 columns, the operation through steps 54–65 is repeated. The answer YES at step 66 indicates the completion of the correction of the erroneous data in the 172 columns. If the answer at step 66 is YES, the operation terminates at step 67. Considering the correction of the erroneous data belonging to the erasures, the number of access operations to the main memory 12 required for correcting the data belonging to all the erasures of the coded data shown in FIG. 2 is reduced to N×86 times in maximum. N is a maximum correctable number of erasures. In the prior process, the N×172 access operations to the main memory 12 was required, as described before.

In the embodiment described, although steps 62–65 are executed after step 61, steps 62–65 can be performed before the process of steps 54–61. In the embodiment, one location including two bytes of the main memory 12 is accessed at one time. However, one location including three or four bytes can be accessed at one time if the main memory 12 is constructed to accept the address operation of a 3-byte or 4-byte scheme.

While the invention has been described with respect to an illustrative embodiment thereof, it will be understood that various changes may be made in the method and means herein described without departing from the scope and teaching of the invention. Accordingly, the described embodiment is to be considered merely exemplary and the invention is not to be limited except as specified in the attached claims.

What is claimed is:

1. A machine-implementable method for detecting and correcting errors and erasures by a processor in systematic product linear block or cyclic error correction-coded (ECC) data arrays written into a memory, said processor accessing said memory, comprising the steps of:
    (a) iteratively syndrome processing the array data in row major order and (1) forming a first map classifying each row containing location indicia of random errors, their correction patterns, and pointers to rows containing erasure errors; and (2) effectuating row array random error corrections in place in memory according to the first map; and
    (b) iteratively syndrome processing the array data in column major order and (1) forming a second map containing location indicia and correction patterns for each pair adjacent position within each column containing erasure errors as indexed by a counterpart row pointer and location indicia within each column containing random errors and their correction patterns; and (2) effectuating column array erasure corrections and random error corrections in place in memory according to the second map.

2. A machine-implementable method for managing detection and correction of errors and erasures in product-coded data arrays in a storage subsystem, said subsystem having a cyclic, tracked medium for storing the data arrays, an accessing mechanism, a local memory, and a processor coupling the mechanism and the memory and responsive to extrinsic commands for (1) causing the mechanism to read selected array data from the medium and write into the local memory, (2) ascertain and correct the error and erasure state from syndromes derived from said array data in row and column directions orthogonally, and (3) stage the corrected data from said subsystem, comprising the steps of:
    (a) iteratively syndrome processing the array data written into the memory in t1 row major order including (1) classifying each row as containing either no errors, random errors, or erasure errors; (2) forming a map (table 1) of indicia and correction patterns for each row containing random errors; (3) forming a pointer to each row containing erasure errors; and (4) effectuating the row array random error corrections in the memory according to the row map; and
    (b) iteratively syndrome processing the array data written into the memory in column major order including (1)

forming a map (table 2) of indicia and correction patterns for each pair adjacent position within a column containing erasure errors as indexed by the row pointer, (2) forming a map for each position within a column containing random errors, and (3) effectuating the column array erasure corrections and the random error corrections in the memory according to the column map.

3. The method according to claim 2, wherein according to step (a) each syndrome-detected "error" connotes an unknown value change of one or more symbols at an unknown location or position within an array row, and further wherein each syndrome-detected "erasure" connotes that while the value of the change is unknown, the location or position within an array is known.

4. The method according to claim 3, wherein according to step (a) three or more syndrome-detected errors within the same array row are classified as an erasure.

5. The method according to claim 2, wherein each array has a row direction and a column direction, and further wherein said product-coded data array is defined over a first systematic linear block or cyclic error correction code (ECC) in row direction and a second linear block or cyclic ECC in the column direction, and still further wherein the data array comprises $K_1 \times K_2$ symbols formed from $K_1$ rows of $(K_2-PI)$ data symbols and PI redundant symbols per row and $K_2$ columns of $(K_1-P0)$ data symbols and P0 redundant symbols per column, the PI redundant symbols per row being derived from the row data symbols according to the first ECC, the P0 redundant symbols per column being derived from the column data symbols according to the second ECC.

6. The method according to claim 2, wherein said medium is formed from a plurality of helical tracks of product-coded array data written onto an optically-readable recording medium conforming to a digital video device (DVD) standard.

7. The method according to claim 2, wherein the step (a)(2) of forming a row map includes the substep of forming a dense row map, and further wherein the step (b)(1) of forming a column map includes the substep of forming a dense column map, a dense map being an information construct containing an ordered list of only those identified array locations subject to error or erasure recovery including correction pattern information.

8. The method according to claim 7, wherein the dense column map includes adjacent column locations subject only to erasure recovery and adjacent column locations subject only random error recovery.

9. The method according to claim 2, wherein step (a)(4) of effectuating random error correction includes the substeps of logically combining the correction pattern recited in the map and the data in error in the array and writing back the combined result in place in the array.

10. A machine-implementable method for managing detection and correction of errors and erasures in systematic product-coded data arrays in a storage subsystem, said subsystem having a cyclic, tracked medium for storing the data arrays, an accessing mechanism, a local memory, and a processor coupling the mechanism and the memory and responsive to extrinsic commands for (1) causing the mechanism to read selected array data from the medium and write into the local memory, (2) ascertain and correct the error and erasure state from syndromes derived from said array data in row and column directions orthogonally, and (3) stage the corrected data from said subsystem, comprising the steps of:

(a) iteratively syndrome processing the array data written into the memory in row major order including (1) classifying each row as containing either no errors, random errors, or erasure errors, three or more syndrome-detected errors within the same array row being classified as an erasure; (2) forming a dense map (table 1) of indicia and correction patterns for each row containing random errors; (3) forming a pointer to each row containing erasure errors; and (4) effectuating the row array random error corrections in the memory according to the row map through logically combining the correction pattern recited in the map and the data in error in the array and writing back the combined result in place in the array; and (b) iteratively syndrome processing the array data written into the memory in column major order including (1) forming a dense map (table 2) of indicia and correction patterns for each pair adjacent position within a column containing erasure errors as indexed by the row pointer, (2) forming a dense map extension for each position within a column containing random errors, the dense column map and extension includes adjacent column locations subject only to erasure recovery and adjacent column locations subject only to random error recovery, and (3) effectuating the column array erasure corrections and the random error corrections in the memory according to the column map.

11. The method according to claim 10, wherein according to step (a) three or more syndrome-detected errors within the same array row is classified as an erasure.

12. The method according to claim 10, wherein said product-coded data array is defined over a first systematic linear block or cyclic error correction code (ECC) in the row direction and a second linear block or cyclic. ECC in the column direction, and further wherein the data array comprises $K_1 \times K_2$ symbols formed from $K_1$ rows of $(K_2-PI)$ data symbols and PI redundant symbols per row and $K_2$ columns of $(K_1-P0)$ data symbols and P0 redundant symbols per column, the PI redundant symbols per row being derived from the row data symbols according to the first ECC, the P0 redundant symbols per column being derived from the column data symbols according to the second ECC.

13. The method according to claim 10, wherein said medium is formed from a plurality of helical tracks of product-coded array data written onto an optically-readable recording medium conforming to a digital video device (DVD) standard.

14. In a subsystem having a cyclic, tracked medium for storing systematic product linear block or cyclic error correction-coded (ECC) data arrays, a local memory, an arrangement for accessing selected arrays from said medium and writing the accessed arrays to the memory, and a processor coupling the accessing arrangement and memory and responsive to external commands, said processor including logic for detecting and correcting errors and erasures in the data arrays written into the memory, said subsystem further comprising:

first ECC logic coupling the processor and the memory for iteratively syndrome evaluating the array data in row major order and (1) forming a first map classifying each row containing location indicia of random errors, their correction patterns, and pointers to rows containing erasure errors; and (2) effectuating row array random error corrections in place in memory according to the first map; and second ECC logic also coupling the processor and memory for iteratively syndrome evaluating the array data in column major order and (1) forming a second dense map containing location indicia and correction patterns for each pair adjacent position within each column containing erasure errors as indexed by a counterpart row pointer and location indicia within each column containing random errors and their correction patterns, and (2) effectuating column array erasure corrections and random error corrections in place in memory according to the second map.

15. The subsystem according to claim 14, wherein said first ECC logic includes circuits for classifying three or more syndrome-detected errors within the same array row as an erasure.

16. The subsystem according to claim 14, wherein said product-coded data array is defined over a first systematic linear block or cyclic error correction code (ECC) in row direction and a second linear block or cyclic ECC in the column direction, and further wherein the data array comprises $K_1 \times K_2$ symbols formed from $K_1$ rows of $(K_2-PI)$ data symbols and PI redundant symbols per row and $K_2$ columns of $(K_1-P0)$ data symbols and P0 redundant symbols per column, the PI redundant symbols per row being derived from the row data symbols according to the first ECC, the P0 redundant symbols per column being derived from the column data symbols according to the second ECC.

17. The subsystem according to claim 14, wherein said medium is formed from a plurality of helical tracks of product-coded array data written onto an optically-readable recording medium conforming to a digital video device (DVD) standard.

18. An article of manufacture comprising a machine-readable memory having stored therein indicia of a plurality of processor-executable control program steps for detecting and correcting errors and erasures by a processor in systematic product linear block or cyclic error correction-coded (ECC) data arrays written into a memory, said processor accessing said memory, comprising the steps of:

(a) indicia of a first control program step for iteratively syndrome processing the array-data in row major order and (1) forming a first dense map classifying each row containing location indicia of random errors, their correction patterns, and pointers to rows containing erasure errors; and (2) effectuating row array random error corrections in place in memory according to the first map; and (b) indicia of a second control program step for iteratively syndrome processing the array data in column major order and (1) forming a second dense map containing location indicia and correction patterns for each pair adjacent position within each column containing erasure errors as indexed by a counterpart row pointer and location indicia within each column containing random errors and their correction patterns, and (2) effectuating column array erasure corrections and random error corrections in place in memory according to the second map.

* * * * *